United States Patent
An et al.

(10) Patent No.: US 11,137,974 B2
(45) Date of Patent: Oct. 5, 2021

(54) METHOD AND APPARATUS FOR AUDIO PROCESSING, ELECTRONIC DEVICE AND STORAGE MEDIUM

(71) Applicant: BAIDU ONLINE NETWORK TECHNOLOGY (BEIJING) CO., LTD., Beijing (CN)

(72) Inventors: Aihui An, Beijing (CN); Rui Gao, Beijing (CN); Dongfang Ji, Beijing (CN)

(73) Assignees: BAIDU ONLINE NETWORK TECHNOLOGY (BEIJING) CO., LTD., Beijing (CN); SHANGHAI XIAODU TECHNOLOGY CO. LTD., Shanghai (CN)

( * ) Notice: Subject to any disclaimer, the term of this patent is extended or adjusted under 35 U.S.C. 154(b) by 0 days.

(21) Appl. No.: 16/703,572

(22) Filed: Dec. 4, 2019

(65) Prior Publication Data

US 2020/0387343 A1 Dec. 10, 2020

(30) Foreign Application Priority Data

Jun. 6, 2019 (CN) .......................... 201910490563.6

(51) Int. Cl.
*H03G 3/20* (2006.01)
*G06F 3/16* (2006.01)
*G10L 19/035* (2013.01)

(52) U.S. Cl.
CPC ............ *G06F 3/165* (2013.01); *G10L 19/035* (2013.01)

(58) Field of Classification Search
CPC .............. H04L 65/1069; H04L 12/282; H04L 65/607; G06F 3/165
(Continued)

(56) References Cited

U.S. PATENT DOCUMENTS

| 7,848,531 B1 | 12/2010 | Vickers |
| 8,813,120 B1 | 8/2014 | Kosslyn |

(Continued)

FOREIGN PATENT DOCUMENTS

| CN | 1627364 A | 6/2005 |
| CN | 102892058 A | 1/2013 |

(Continued)

OTHER PUBLICATIONS

The first OA of the Priority CN Application.
The second OA of the parallel JP application.
The first Office Action of parallel JP application.

*Primary Examiner* — George C Monikang
(74) *Attorney, Agent, or Firm* — J.C. Patents

(57) ABSTRACT

The present application provides a method for audio processing, an apparatus, an electronic device and a storage medium, the method includes: performing a segmentation processing on an audio to be processed to obtain N audio segments, N is an integer larger than or equal to 2; obtaining a target sequence according to maximum volume values of each of the audio segments, the target sequence includes: maximum volume values of M audio segments sorted in order of maximum volume values from large to small, M is a positive integer smaller than N; obtaining a volume adjustment parameter of the audio to be processed according to the target sequence, the volume adjustment parameter is used to adjust playing volume of the audio to be processed to target volume. The method avoids the problem that the user frequently adjusts the volume of the audio.

17 Claims, 6 Drawing Sheets

(58) Field of Classification Search
USPC .................................. 381/77, 104–105, 107
See application file for complete search history.

(56) References Cited

U.S. PATENT DOCUMENTS

| | | | | |
|---|---|---|---|---|
| 10,802,938 | B2* | 10/2020 | Benzaia | ................. G06F 3/165 |
| 2011/0035030 | A1* | 2/2011 | Dittmer-Roche | .... H03G 3/3089 |
| | | | | 700/94 |
| 2012/0294461 | A1* | 11/2012 | Maeda | .................... H03G 3/10 |
| | | | | 381/107 |
| 2016/0085566 | A1 | 3/2016 | Benzaia | |
| 2017/0351482 | A1 | 12/2017 | Niuwenhuys | |

FOREIGN PATENT DOCUMENTS

| | | | |
|---|---|---|---|
| CN | 102999492 | A | 3/2013 |
| CN | 103095866 | A | 5/2013 |
| CN | 105828102 | A | 8/2016 |
| CN | 105849801 | A | 8/2016 |
| CN | 106445451 | A | 2/2017 |
| CN | 106775563 | A | 5/2017 |
| CN | 109508170 | A | 3/2019 |
| CN | 109656511 | A | 4/2019 |
| JP | 2005100612 | A | 4/2005 |
| JP | 3881361 | B1 | 2/2007 |
| JP | 2007531933 | A | 11/2007 |
| JP | 2001318681 | A | 11/2016 |
| WO | WO2015098564 | A1 | 7/2015 |

* cited by examiner

Terminal　　　　　　　　　　Server

METHOD AND APPARATUS FOR AUDIO PROCESSING, ELECTRONIC DEVICE AND STORAGE MEDIUM

CROSS-REFERENCE TO RELATED APPLICATION

This application claims priority to Chinese Patent Application No. CN201910490563.6, filed on Jun. 6, 2019, which is hereby incorporated by reference in its entirety.

TECHNICAL FIELD

The present application relates to a field of intelligent terminal, and in particular to a method for audio processing, an apparatus for audio processing, an electronic device and a storage medium.

BACKGROUND

With popularity of intelligent terminals, users often use intelligent terminals to play music, broadcast or other audio.

Due to differences in audio sources (for example, providers are different), volume of the audio is different when playing through a terminal, which may cause the volume during audio playback to be too large or too small, so a user needs to adjust the volume frequently. For example, when the terminal plays music A, the volume is 30 db, but the volume becomes 10 db when playing broadcast B, a sudden decrease in volume may make the user unable to hear contents of broadcast B, and the user needs to turn up the volume.

SUMMARY

The present application provides a method for audio processing, an apparatus for audio processing, an electronic device and a storage medium, which avoids the problem that the user frequently adjusts the volume of audio.

A first aspect of the present application provides a method for audio processing, including:

performing a segmentation processing on an audio to be processed to obtain N audio segments, the N is an integer larger than or equal to 2;

obtaining a target sequence according to maximum volume values of each of the audio segments, the target sequence includes: maximum volume values of M audio segments sorted in order of maximum volume values from large to small, the M is a positive integer smaller than the N; and obtaining a volume adjustment parameter of the audio to be processed according to the target sequence, the volume adjustment parameter is used to adjust playing volume of the audio to be processed to target volume.

A second aspect of the present application provides a method for audio processing, including:

receiving audio information from a server, the audio information includes a link address of the audio to be processed and the volume adjustment parameter;

obtaining the audio to be processed according to the link address of the audio to be processed; and playing the audio to be processed according to the volume adjustment parameter.

A third aspect of the present application provides an apparatus for audio processing, including:

a processing module, configured to perform a segmentation processing on an audio to be processed to obtain N audio segments, the N is an integer larger than or equal to 2;

obtain a target sequence according to maximum volume values of each of the audio segments, the target sequence includes: maximum volume values of M audio segments sorted in order of maximum volume values from large to small, the M is a positive integer smaller than the N; obtain a volume adjustment parameter of the audio to be processed according to the target sequence, the volume adjustment parameter is used to adjust playing volume of the audio to be processed to target volume.

A fourth aspect of the application provides an apparatus for audio processing, including:

a transceiver module, configured to receive audio information from a server, the audio information includes a link address of the audio to be processed and the volume adjustment parameter;

a processing module, configured to obtain the audio to be processed according to the link address of the audio to be processed, and play the audio to be processed according to the volume adjustment parameter.

A fifth aspect of the present application provides an electronic device, including: at least one processor and a memory;

the memory is configured to store computer execution instructions;

the at least one processor is configured to execute the computer execution instructions stored in the memory, such that the electronic device performs the method for audio processing according to the first aspect or the second aspect.

A sixth aspect of the present application provides a computer readable storage medium, the computer readable storage medium is stored with computer execution instructions, and when the computer execution instructions are executed by a processor, the method for audio processing according to the first aspect or the second aspect method is implemented.

The present application provides a method for audio processing, an apparatus for audio processing, an electronic device and a storage medium, the method includes: performing a segmentation processing on an audio to be processed to obtain N audio segments, N is an integer larger than or equal to 2; obtaining a target sequence according to maximum volume values of each of the audio segments, the target sequence includes: maximum volume values of M audio segments sorted in order of maximum volume values from large to small, M is a positive integer smaller than N; obtaining a volume adjustment parameter of the audio to be processed according to the target sequence, the volume adjustment parameter is used to adjust playing volume of the audio to be processed to target volume. The method for audio processing provided by the present application can process and adjust volume of a playing audio by using a volume adjustment parameter obtained in advance, so that the playing volume of the audio is adjusted to target volume, thereby avoiding the problem that the user frequently adjusts the volume of the audio.

DESCRIPTION OF EMBODIMENTS

In order to make purpose, technical solution and advantages of the embodiments of the present application more clear, the technical solutions in the embodiments of the present application are clearly and completely described in following with reference to the embodiments of the present application, obviously, the described embodiments are part of the embodiments of the present application, and not all of them. Based on the embodiments in the present application, all other embodiments obtained by those skilled in the art without creative efforts are within the scope of the present application.

In order to solve a problem in the prior art that volume of audios played by a terminal is different due to different sources of audios, which requires a user needs to frequently adjust the volume. The present application provides a method for audio processing, a volume adjustment parameter of an audio is obtained by processing and analyzing the audio in advance, a purpose of adjusting playing volume of the audio to be processed to target volume is achieved by using the volume adjustment parameter. The method for audio processing provided by the present application will be described below in conjunction with specific application scenes and embodiments.

Figure 1:
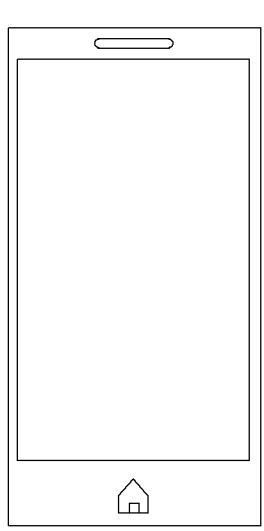
FIG. 1 is a schematic diagram of a scene applicable to a method for audio processing provided by the present application.
Figure 1:
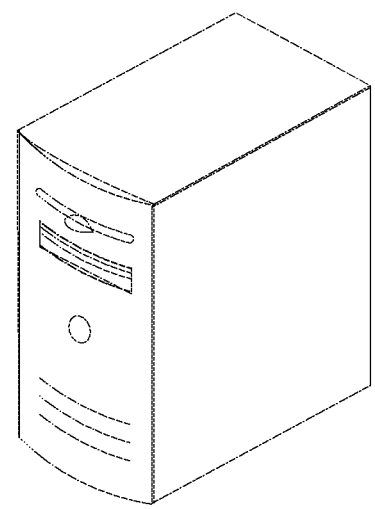

FIG. 1 is a schematic diagram of a scene applicable to a method for audio processing provided by the present application. As shown in FIG. 1, the scene can include: a server and a terminal. The server may be a cloud server, the cloud server may provide audio to the terminal. The terminal may include but is not limited to a mobile terminal or a fixed terminal integrated with an audio playback function. The mobile terminal device includes, but is not limited to, a mobile phone, a Personal Digital Assistant (PDA), a tablet computer, a portable device (for example, a portable computer, a pocket computer, or a handheld computer) etc. The fixed terminal includes but is not limited to a desktop computer, a video and audio device, a smart TV, a smart speaker, etc.

Figure 2:
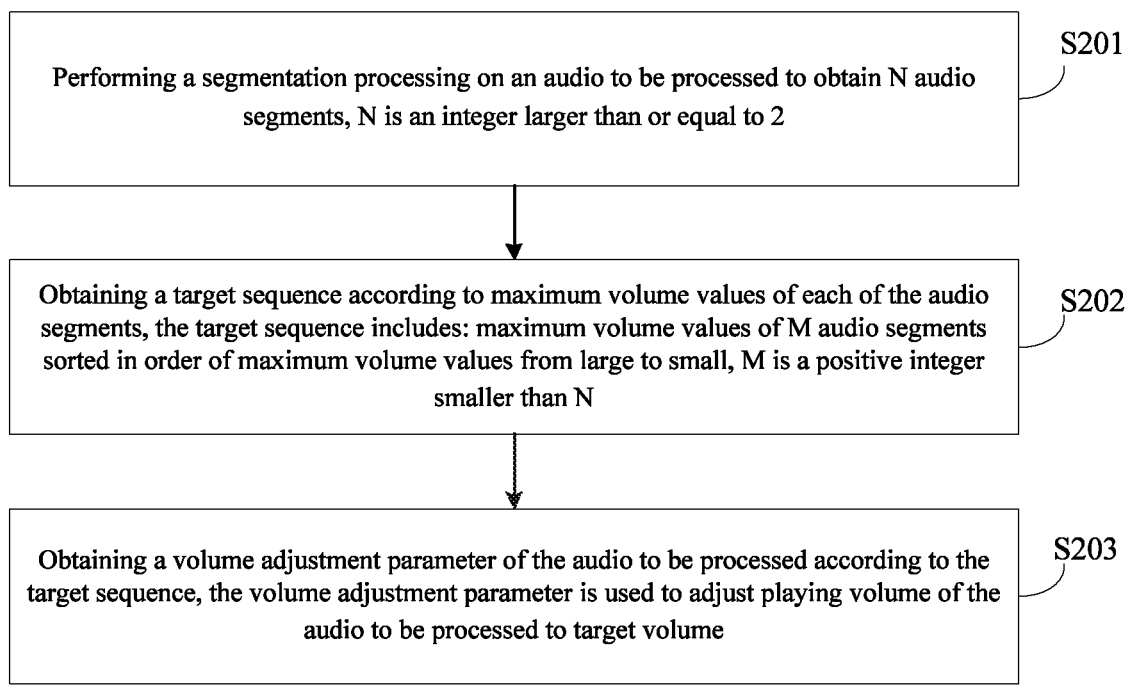
FIG. 2 is a schematic flowchart I of a method for audio processing provided by the present application.

The method for audio processing of the present application is explained from the perspective of interaction between a server and a terminal with reference to FIG. 2 below. FIG. 2 is a schematic flowchart I of a method for audio processing provided by the present application. As shown in FIG. 2, the method for audio processing provided in this embodiment may include:

S201, a server performs a segmentation processing on an audio to be processed to obtain N audio segments, N is an integer larger than or equal to 2.

In this embodiment, a segmentation processing may be performed on an audio to be processed to obtain N audio segments. Optionally, the method of segmentation processing can be frame-by-frame segmentation, periodic segmentation, segmentation per second, etc. N is an integer larger than or equal to 2.

The frame-by-frame segmentation may be performed according to a time sequence of a multi-frame audio forming the audio to be processed, that is, each frame of audio is an audio segment. For example, if information of the audio to be processed includes 2000 frames of audio, each frame of audio can be an audio segment.

The periodic segmentation may be splitting the audio to be processed once every same time, for example, starting from a start time of the audio to be processed, splitting the audio to be processed every 250 ms, that is, each audio segment in the N audio segments is 250 ms.

The segmentation per second may be splitting the audio corresponding to each second into m frames, and then acquiring arbitrary p frames in each second, where the p frames obtained in per second can be an audio segment. For example, for an audio with a duration of 2 s, split the audio of 2 s into two audios of 1 s, split each audio of 1 s into m frames, obtain p frames in the m frames corresponding to each audio of 1 s, then use the p frames as an audio segment. It should be understood that m is an integer larger than 2, and p is a positive integer smaller than m. In this embodiment, the processing method of performing the segmentation processing on the audio to be processed is not limited.

S202, A Server obtains a target sequence according to maximum volume values of each of the audio segments, the target sequence includes: maximum volume values of M audio segments sorted in order of maximum volume values from large to small, M is a positive integer smaller than N.

In this embodiment, the volume value of each time point of the audio to be processed can be stored in the server, where the volume value of each time point can be the volume value of the audio to be processed at every millisecond. In this embodiment, the audio segment obtained by the segmentation manner according to any one of the above 201 may include: an audio of at least one time point. For example, in the manner of frame-by-frame segmentation, one audio segment is an audio of one frame, and the audio of one frame may include the audio of at least one time point. In the manner of periodic segmentation, one audio segment is 250 ms, i.e., the audio of multiple time points.

The maximum volume value of an audio segment can be determined according to volume values of each time point in the audio segment, and then a target sequence can be obtained according to the maximum volume values of each of the audio segments. In this embodiment, the target sequence includes: maximum volume values of M audio segments sorted in order of maximum volume values from large to small, M is a positive integer smaller than N.

Optionally, in this embodiment, the maximum volume values of each of the N audio segments can be sorted from large to small, and the maximum volume values of the top M is obtained to form a target sequence. For example, N is 8, and the maximum volume values corresponding to the 8 audio segments are, when being sorted from large to small, 30 db, 28 db, 27 db, 24 db, 22 db, 21 db, 20 db, and 19 db. If M is 5, the target sequence corresponding to the 8 audio segments is: {30 db, 28 db, 27 db, 24 db, 22 db}.

Optionally, the M in the target sequence can be a preset value, and the M is the same for different audios to be processed. Optionally, in this embodiment, in order to determine the target sequence more quickly and accurately, and then obtain the volume adjustment parameter of the audio to be processed more quickly and accurately, the M in the target sequence can also be determined according to attribute of the audio to be processed. For example, the attribute of the audio to be processed can be duration of the audio to be processed. Correspondingly, for the audio to be processed having different durations, M is different, for example, the smaller the duration of the audio to be processed, the smaller the M, the larger the duration of the audio to be processed, the larger the M. That is, for the audio to be processed with a smaller duration, the possibility of a sudden change in volume is lower, thus select a smaller M, i.e., select a smaller amount of maximum volume value, so that the target sequence can be quickly determined. However, for the audio to be processed with a longer duration, the possibility of volume change is higher, thus select a larger M, i.e., select a larger amount of maximum volume values, so that a more accurate target sequence can be obtained.

Optionally, the attribute of the audio to be processed can be a type of the audio to be processed. Correspondingly, for different types of audios to be processed, M is different. For example, for audio of audiobooks, due to its relatively quiet volume and less possibility of sudden change, a smaller M may be determined. However, for music-like audio, due to the potential big volume change between the audio's partial intro and chorus parts, a larger M may be determined.

Optionally, in the server in this embodiment, a correspondence between the attribute of the audio to be processed and the M in the target sequence is preset in advance, and therefore, when determining the target sequence, the top M maximum volume values in the sorted maximum volume values of N audio segments may be taken as the target sequence according to the attribute of the audio to be processed.

S203, the server obtains a volume adjustment parameter of the audio to be processed according to the target sequence, the volume adjustment parameter is used to adjust playing volume of the audio to be processed to target volume.

In this embodiment, the volume adjustment parameter is used to adjust playing volume of the audio to be processed to target volume. The target sequence includes M maximum volume values. Optionally, the volume adjustment parameter may be an average value of the M maximum volume values. That is, the volume adjustment parameter can indicate a volume index of the audio to be processed, and the terminal can adjust the playing volume of the audio to be processed to the target volume according to the volume index of the audio to be processed. Details about how the terminal adjusts the playing volume of the audio to be processed to the target volume according to the volume adjustment parameter will be described in following embodiments.

Figure 3:
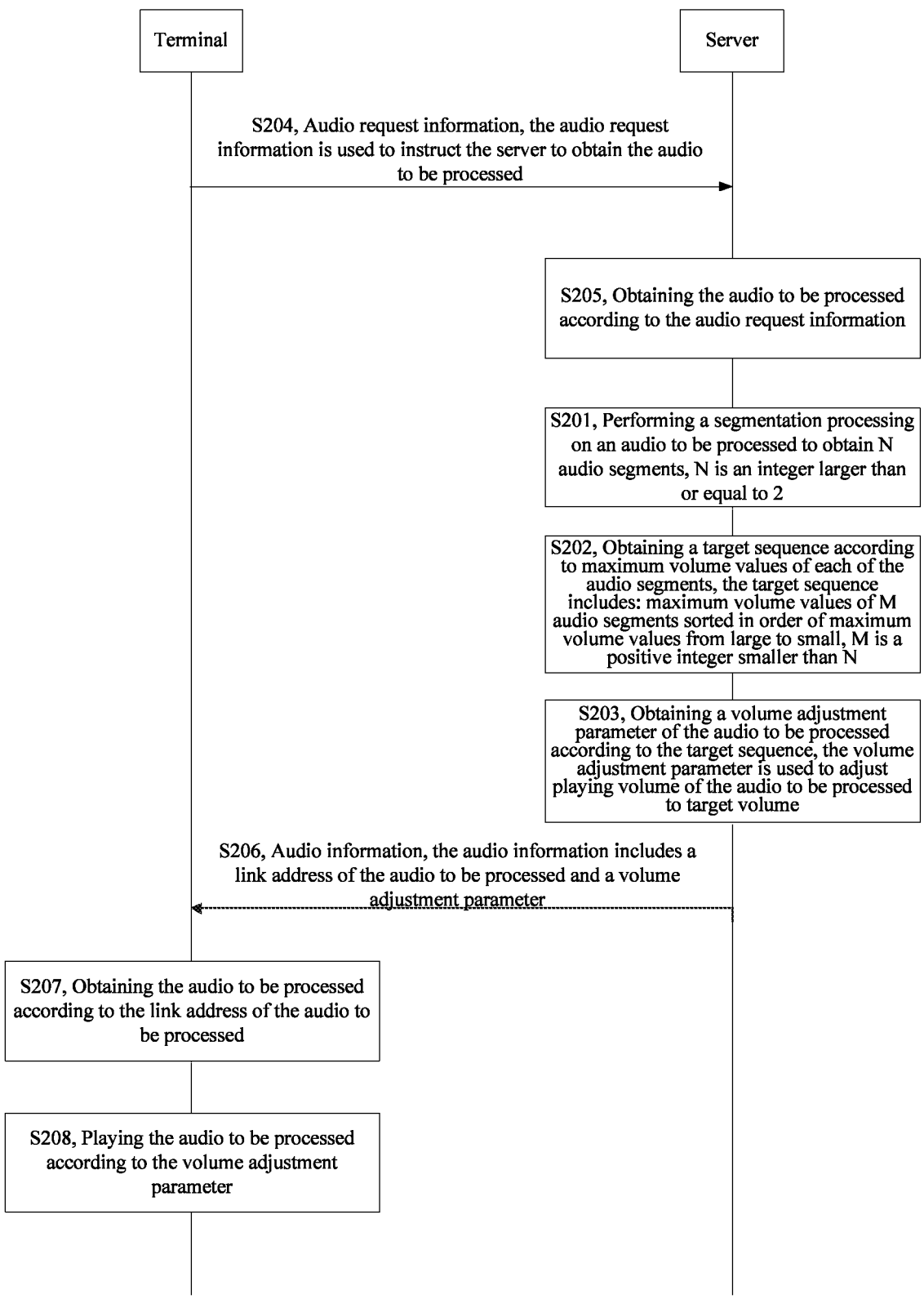
FIG. 3 is a schematic flowchart II of a method for audio processing provided by the present application.

Optionally, in this embodiment, the process of complete interaction between the server and the terminal will be described in conjunction with FIG. 3. FIG. 3 is a schematic flowchart II of a method for audio processing provided by the present application. Before S201, the method for audio processing provided in this embodiment may further include:

S204, the terminal sends audio request information to the server, where the audio request information is used to instruct the server to obtain the audio to be processed.

Correspondingly, the server receives the audio request information sent by the terminal.

Illustratively, when the terminal is a smart speaker, the smart speaker can perform voice interaction with the user. When the user wants to listen to music, for example, the user says "play a Song A", correspondingly, the smart speaker receives and analyzes the user's audio to obtain the user's audio request semantics. The smart speaker can send audio request information to the server according to the user's audio request semantics, correspondingly, the audio request information is used to instruct the server to obtain the audio to be processed, and the audio to be processed is "Song A".

Illustratively, when the terminal is a smart phone, the user may input the name of "Song A" on a terminal interface to trigger the terminal to send audio request information to the server, and correspondingly, the audio request information is used to instruct the server to obtain "Song A".

It should be understood that, for different application scenes, the manner in which the terminal sends the audio request information to the server may be different. However, the audio request information is used to instruct the server to obtain the audio to be processed.

S205, the server obtains the audio to be processed according to the audio request information.

After receiving the audio request information, the server may obtain the audio to be processed according to the audio request information. Optionally, the server can query whether the audio to be processed is included in a local database of the server according to the audio to be processed indicated by the audio request information.

Correspondingly, after S203, the method may also include:

S206, the server sends audio information to the terminal, where the audio information includes a link address of the audio to be processed and a volume adjustment parameter, the audio information is used to instruct the terminal to obtain the audio to be processed according to the link address of the audio to be processed, and play the audio to be processed according to the volume adjustment parameter.

Correspondingly, the terminal receives audio information from a server.

The audio information in this embodiment includes the link address of the audio to be processed and the volume adjustment parameter. Optionally, the link address of the audio to be processed in this embodiment may be a Uniform Resource Location (URL). The audio information is used to instruct the terminal to obtain the audio to be processed according to the link address of the audio to be processed, and play the audio to be processed according to the volume adjustment parameter.

Optionally, the server may store the volume adjustment parameter in the audio information by using a field when sending the audio information to the terminal.

S207, the terminal obtains the audio to be processed according to the link address of the audio to be processed.

In this embodiment, the form of the link address of the audio to be processed is not limited. The server and the terminal may have an agreement on the encryption/decryption mode or an agreement on the protocol, so that the terminal can decrypt the audio information to obtain the link address of the audio to be processed and the volume adjustment parameter when receiving the audio information. Correspondingly, when the server sends the audio information to the terminal, the server may encapsulate and encrypt the audio information by using a corresponding encryption mode.

In this embodiment, when the server does not directly send the audio to be processed to the terminal, the occupied bandwidth of the audio information is reduced. Correspondingly, after obtaining the link address of the audio to be processed, the terminal may obtain the audio to be processed according to the link address of the audio to be processed.

Obtaining the audio to be processed may be downloading the audio to be processed according to the link address of the audio to be processed.

S208, the terminal plays the audio to be processed according to the volume adjustment parameter.

According to the related description in the above S203, the volume adjustment parameter can indicate the volume index of the audio to be processed, and thus the terminal can adjust the playing volume of the audio to be processed to the target volume when playing the audio to be processed according to the volume adjustment parameter. It should be understood that the target volume may be a preset target volume value. For example, the target volume value may be −3 db.

The present application provides a method for audio processing, the method includes: performing a segmentation processing on an audio to be processed to obtain N audio segments, N is an integer larger than or equal to 2; obtaining a target sequence according to maximum volume values of each of the audio segments, where the target sequence includes: M maximum volume values of audio segments sorted in order of maximum volume values from large to small, M is a positive integer smaller than N; obtaining a volume adjustment parameter of the audio to be processed according to the target sequence, the volume adjustment parameter is used to adjust playing volume of the audio to be processed to target volume. The method for audio processing provided by the present application can adjust the volume of the played audio by using the volume adjustment parameter obtained in advance, so that the playing volume of the audio is adjusted to the target volume, thereby avoiding the problem that the user frequently adjusts the volume of the audio.

Figure 4:
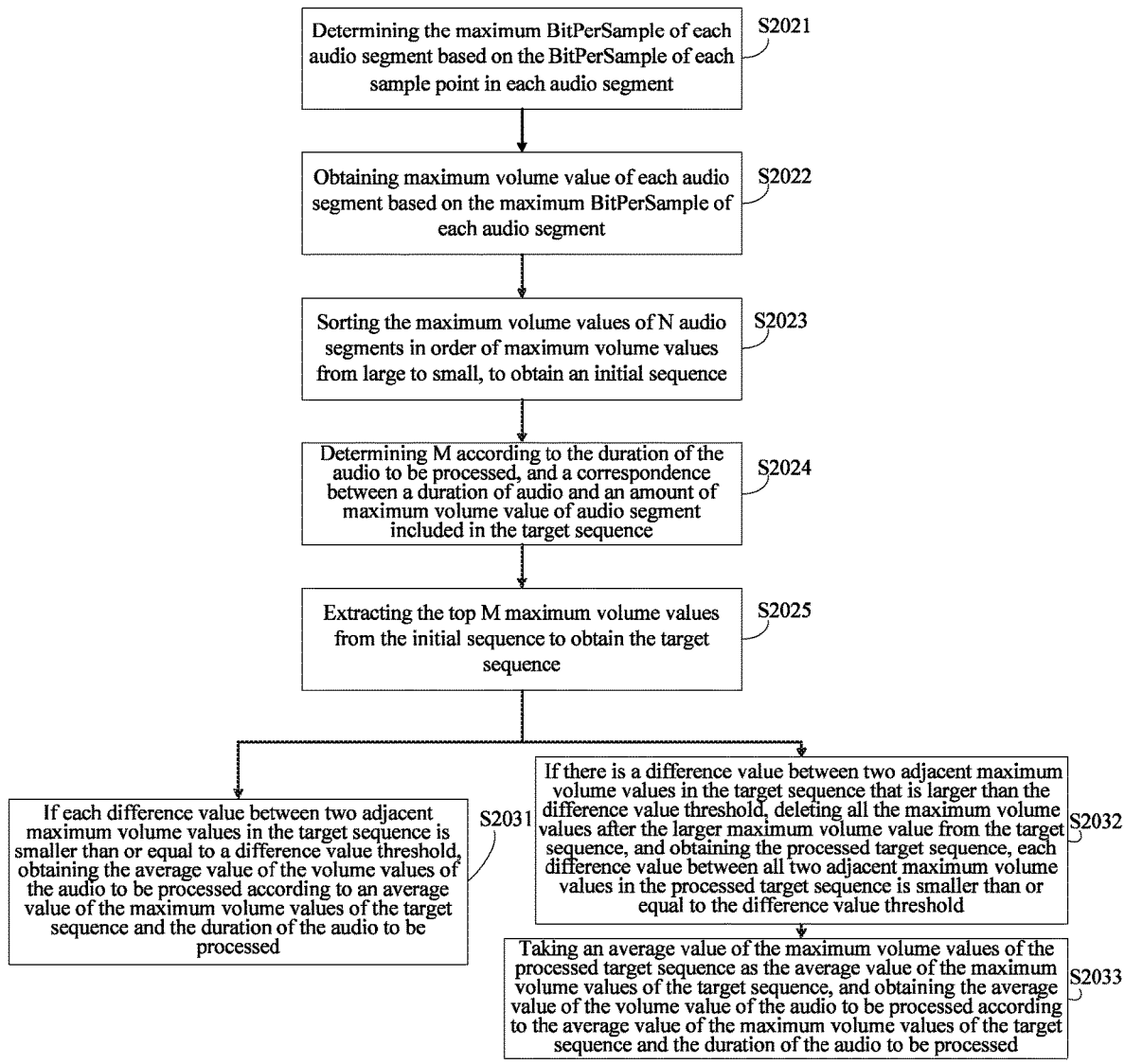
FIG. 4 is a schematic flowchart of obtaining a volume adjustment parameter provided by the present application.

The process of obtaining the volume adjustment parameter according to the target sequence by the server in the above embodiment S203 will be described below with reference to FIG. 4. In order to better explain the process of obtaining the volume adjustment parameters, the target sequence of the present embodiment and the manner of obtaining the target sequence are explained firstly. FIG. 4 is a schematic flowchart of obtaining a volume adjustment parameter provided by the present application. As shown in FIG. 4, correspondingly, the S202 in the above embodiment may include:

S2021, determining maximum audio quantization values of each audio segment based on audio quantization values of each sample point in each audio segment.

In this embodiment, the server may further store audio data of the audio to be processed, where the audio data may be a correspondence between the sample point of the audio to be processed and the audio quantization value. The sample point refers to a sample time point, where the sample time point may be a time point in the above S201. The audio quantization value refers to a quantization value of an audio signal of the corresponding sample point after being quantized. The quantization process refers to digitizing the amplitude of an analog signal of the audio signal of the sample point, that is, the audio quantization value is determined according to the value range of the analog signal of the audio signal. The more bits of the audio quantization value, as the number of bits representing colors (8 bits for 256 colors and 16 bits for 65536 colors), the higher the resolution of the audio, the more amplitude change of the audio signal can be refined.

After obtaining the N audio segments, the audio quantization value of each of the N audio segments may be obtained according to the stored relationship between the sample point of the audio to be processed and the audio quantization value. In further, the maximum audio quantization value can be determined in each audio segment.

Illustratively, N is 2, there are three sample points in each audio segment, and the audio quantization values corresponding to the three sample points in the first audio segment are 10000, 15000, and 20000, respectively, the audio quantization values corresponding to the three sample points in the second audio segment are 15000, 20000, and 25000. Correspondingly, the maximum audio quantization values in the two audio segments are 20000 and 25000, respectively.

S2022, obtaining the maximum volume value of each audio segment based on the maximum audio quantization value of each audio segment.

The maximum volume value of each audio segment in this embodiment is: the volume value corresponding to the maximum audio quantization value of each audio segment. The audio quantization value and the volume value have a corresponding conversion relationship, and the volume value corresponding to each sample point can be obtained according to the audio quantization value of each sample point. Correspondingly, according to the maximum audio quantization value of each audio segment, the maximum volume value of each audio segment can be obtained.

The correspondence between the audio quantization value and the volume value can be shown in following formula;

$$Y = 10^{\frac{X}{20}} \cdot 32768 \qquad \text{Formula 1}$$

Where Y represents the audio quantization value, X represents the volume value.

Illustratively, after obtaining the maximum audio quantization value of each audio segment, the maximum volume value of each audio segment can be obtained according to the formula.

S2023, sorting the maximum volume values of N audio segments in order of maximum volume values from large to small, to obtain an initial sequence.

After obtaining the maximum volume value of each audio segment, in order of maximum volume values from large to small, sort the maximum volume values of N audio segments to obtain the initial sequence.

Illustratively, for example, if N is 8, and the maximum volume values corresponding to the 8 audio segments, sorted from large to small, are 30 db, 28 db, 27 db, 24 db, 22 db, 21 db, 20 db, and 19 db. Correspondingly, the initial sequence is {30 db、 28 db、 27 db、 24 db、 22 db、 21 db、 20 db and 19 db}.

S2024, determining M according to the duration of the audio to be processed, and the correspondence between the duration of audio and the amount of maximum volume values of audio segment included in the target sequence.

In this embodiment, for audios to be processed with different durations, the amounts of maximum volume values in the corresponding target sequences are also different. Optionally, for example, the smaller the duration of the audio to be processed, the smaller the M, the larger the duration of the audio to be processed, the larger the M. That is, for the audio to be processed with a smaller duration, the possibility of a sudden change in volume is lower, thus a smaller M can be selected, and then the target sequence can be determined quickly according to a smaller maximum volume value. However, for the audio to be processed with a longer duration, the possibility of volume change is higher, thus the larger M is needed, that is, more maximum volume values are needed to obtain an accurate target sequence.

Illustratively, Table 1 as below shows the correspondence between the duration of audio and M, which is the amount of maximum volume values of the audio segment included in the target sequence. It should be understood that Table 1 is only one form of the correspondence.

TABLE 1

| The duration of the audio to be processed T (minutes) | The amount of maximum volume values in the target sequence M |
|---|---|
| 0 < T ≤ 1 | 1 |
| 1 < T ≤ 5 | 5 |
| 5 < T | 10 |

As shown in Table 1, if the duration of the audio to be processed is between 1 minute and 5 minutes, according to the correspondence between the duration of audio and the amount of maximum volume values of the audio segment included in the target sequence, it may be determined that M, which is the amount of maximum volume values included in the target sequence, corresponding to the audio to be processed is 5.

S2025, extracting the top M maximum volume values from the initial sequence to obtain the target sequence.

In this embodiment, the top M maximum volume values can be extracted from the initial sequence, i.e., the N maximum volume values, to obtain the target sequence. In other words, the top M maximum volume values of the N maximum volume values form the target sequence.

Illustratively, if the duration of the audio to be processed is between 1 minute and 5 minutes, M is 5. When the initial sequence is {30 db, 28 db, 27 db, 24 db, 22 db, 21 db, 20 db, and 19 db}, the target sequence is {30 db, 28 db, 27 db, 24 db, 22 db}.

The manner of obtaining the target sequence in the present application is described in detail above. Based on the above S2021-S2025, the process of obtaining the volume adjustment parameter provided by the present application is further described below with reference to FIG. 4. As shown in FIG. 4, obtaining the volume adjustment parameter S203 in this embodiment may include:

S2031, if each difference value between two adjacent maximum volume values in the target sequence is smaller than or equal to a difference value threshold, obtaining an average value of the volume values of the audio to be processed according to an average value of the maximum volume values of the target sequence and the duration of the audio to be processed.

The target sequence includes M maximum volume values sorted from large to small. It should be understood that the volume adjustment parameter in this embodiment is average value of the volume value of the audio to be processed.

In this embodiment, make a difference to the adjacent maximum volume values in the target sequence to obtain a difference value between two adjacent maximum volume values. If each difference value between all two adjacent maximum volume values in the target sequence is smaller than or equal to the difference value threshold, obtain the average value of the volume value of the audio to be processed according to the average value of the maximum volume values of the target sequence and the duration of the audio to be processed.

Illustratively, for example, the target sequence is {30 db, 28 db, 27 db, 25 db, 24 db}, and the difference value threshold is 3 db. Each difference between two adjacent maximum volume values in the target sequence is smaller than the difference value threshold, the average value of the maximum volume values in the target sequence (for example, 26.8 db) and the duration of the audio to be processed are obtained, and then the average value of the volume values of the audio to be processed is obtained.

S2032, if there is a difference value between two adjacent maximum volume values in the target sequence that is larger than the difference value threshold, deleting all the maximum volume values after the larger maximum volume value from the target sequence, to obtain the processed target sequence, each difference value between all two adjacent maximum volume values in the processed target sequence is smaller than or equal to the difference value threshold.

In this embodiment, make a difference to the two adjacent maximum volume values in the target sequence to obtain a difference value between two adjacent maximum volume values. If there is a difference value between the two adjacent maximum volume values in the target sequence that is larger than the difference value threshold, all the maximum volume values after the larger maximum volume value are deleted from the target sequence, to obtain the processed target sequence.

Illustratively, for example, the target sequence is {30 db, 28 db, 27 db, 22 db, 21 db}, and the difference value threshold is 3 db. The difference value between 27 db and 22 db in the target sequence is larger than the difference value threshold, all the maximum volume values after the larger maximum volume value 27 db are deleted from the target sequence, and the processed target sequence {30 db, 28 db, 27 db} is obtained.

Correspondingly, each difference value between two adjacent maximum volume values in the processed target sequence is smaller than or equal to the difference value threshold. As shown above, each difference value between two adjacent maximum volume values in the processed target sequence {30 db, 28 db, 27 db} is smaller than 3 db.

S2033, taking the average value of the maximum volume values of the processed target sequence as the average value of the maximum volume values of the target sequence, and obtaining the average value of the volume value of the audio to be processed according to the average value of the maximum volume values of the target sequence and the duration of the audio to be processed.

In this embodiment, the maximum volume value of the processed target sequence obtained by processing the target sequence may be taken as the average value of the maximum volume value of the target sequence. Illustratively, for example, the average value of the target sequence {30 db, 28 db, 27 db}, 28.3 db, is taken as the maximum volume value of the target sequence. Further, according to the average value of the maximum volume values of the target sequence, 28.3 db, and the duration of the audio to be processed, obtain the average value of the volume value of the audio to be processed. For the process of obtaining the average value of the volume value of the audio to be processed according to the average value of the maximum volume values of the target sequence and the duration of the audio to be processed, refer to the related description in S2023, and no further description is provided herein.

It should be understood that the above S2031 and S2032-S2033 are alternative execution modes, and there is no difference in order.

In this embodiment, the specific manner for obtaining the average value of the volume value of the audio to be processed according to the maximum volume values of the target sequence and the duration of the audio to be processed may be:

1. If the duration of the audio to be processed is less than or equal to the duration threshold, taking the average value of the maximum volume value of the target sequence is as a candidate average value, and obtaining the average value of the volume values of the audio to be processed according to the candidate average value.

2. If the duration of the audio to be processed is larger than the duration threshold, determining a smooth processing coefficient according to the target sequence, processing the average value of the maximum volume value of the target sequence according to the smooth processing coefficient to obtain the candidate average value, and obtaining the average value of the volume value of the audio to be processed according to the candidate average value.

In this embodiment, the server stores a duration threshold, e.g., the duration threshold is 5 minutes. Since each difference value between all two adjacent maximum volume values in the target sequence (including the above processed target sequence) is smaller than or equal to the difference value threshold, the target sequence is used to indicate that there's only smooth change, no sudden change, between the maximum volume values of the audio to be processed. For the audio to be processed with a short duration, such as audio with a duration of less than 5 minutes, the possibility of having a sudden change of the audio before and after is low. For the audio to be processed with a longer duration, such as audio with a duration of more than 5 minutes, in the first 5 minutes, the possibility of having a sudden change of the audio before and after is high, however, as the duration increases, the possibility of having a sudden change of the volume of the audio before and after is high. Therefore, it is further necessary to perform smooth processing on the average value of the maximum volume value of the target sequence of the audio to be processed whose duration is longer than the duration threshold.

In this embodiment, the smooth processing coefficient can be determined according to the target sequence. Optionally, the smooth processing coefficient is determined based on the maximum volume value in the target sequence. For example, in this embodiment, a rule for obtaining the smooth processing coefficient based on the maximum volume value in the target sequence may be set in advance. For example, according to the audio with a duration of more than 5 minutes shown in Table 1 above, the number of the maximum volume values in the target sequence is 10. In order to be able to reflect the volume change of the audio to be processed as much as possible, in this embodiment, obtain a quotient value of the first maximum volume value and the fifth maximum volume value in the target sequence. The smooth processing coefficient of the target sequence is determined according to the quotient value, and a correspondence between the quotient value and the smooth processing coefficient set in advance.

The correspondence between the quotient value and the smooth processing coefficient is shown in Table 2 below:

TABLE 2

| quotient value | the smooth processing coefficient |
|---|---|
| 1.122 ≤ Max (1)/Max (5) < 1.259 | 1.122 |
| 1.259 ≤ Max (1)/Max (6) < 1.413 | 1.259 |
| 1.413 ≤ Max (1)/Max (6) | 1.413 |

As shown in Table 2, Max(1) and Max(5) are the first maximum volume value and the fifth maximum volume value in the target sequence, respectively, Max(1)/Max(5) is the quotient value of the first maximum volume value and the fifth maximum volume value. The quotient value has a correspondence with the smooth processing coefficient. In this embodiment, the smooth processing coefficient of the target sequence of the audio to be processed may be determined according to the quotient value of the first maximum volume value and the fifth maximum volume value in the audio to be processed, and the correspondence between the quotient value and the smooth processing coefficient.

Optionally, in this embodiment, processing the average value of the maximum volume value of the target sequence according to the smooth processing coefficient, that is, dividing the average value of the maximum volume value of the target sequence by the smooth processing coefficient, and obtaining the candidate average value.

Following describes the manner in which the average value of the volume value of the audio to be processed is obtained according to the candidate average value in the embodiment:

In this embodiment, after obtaining the candidate average value, taking the candidate average value as an average value of a volume value of an assumed final audio to be processed to process the volume value of the audio to be processed, detecting whether the volume value, which is obtained after processing the audio to be processed according to the candidate average value processing, exceeds an upper limit of the preset volume range, and whether the candidate average value needs to be processed. The preset volume range is preset.

Optionally, in this embodiment, obtain a cutoff volume value based on the candidate average value, the preset volume value, and the first maximum volume value in the target sequence.

The cutoff volume value g can be obtained according to following formula 2:

$$g = \frac{M'_{avg}}{A} \cdot \text{Max}(1) \qquad \text{Formula 2}$$

$M_{avg}'$ represents the candidate average value, A represents the preset volume value, Max(1) is the first maximum volume value in the target sequence.

If the cutoff volume value is smaller than or equal to 0, it is determined that the volume value obtained after processing the audio to be processed according to the candidate average value does not exceed the upper limit of the preset volume range, the candidate average value can be directly taken as the volume value of the audio to be processed.

If the cutoff volume value is larger than 0, it is determined that the volume value, which is obtained after processing the audio to be processed according to the candidate average value, exceeds the upper limit of the preset volume range, then perform a reduction processing on the candidate average value, so that the cutoff volume value obtained according to the candidate average value after the reduction processing is smaller than or equal to 0, and the candidate average value after the reduction processing is taken as the average value of the volume value of the audio to be processed. That is to say, if the cutoff volume value g obtained by the reduction processing is smaller than or equal to 0 according to the above formula 2, the candidate average value after the reduction processing is taken as the average value of the audio value of the audio to be processed.

The manner of performing the reduction processing on the candidate average may be performing the reduction processing according to a certain reduction interval. For example, the candidate average value is 30 db, the reduction processing may be performed to reduce 2 db of the candidate average value each time.

In this embodiment, when obtaining the target sequence, the amount of maximum volume values included in the target sequence can be flexibly determined according to the duration of the audio to be processed, and the target sequence can be quickly and accurately obtained. Further, in this embodiment, after obtaining the target sequence, perform the dithering processing on the maximum volume values in the target sequence (i.e., all maximum volume values after the larger maximum volume value are deleted from the target sequence), and process the average value of the maximum volume value of the target sequence according to the duration of the audio to be processed, so that the obtained average value of the volume values of the audio to be processed, i.e. the volume adjustment parameter, is more accurate, and more suitable for representing audio characteristics of the audio to be processed. It enables the terminal to accurately process the audio to be processed according to the volume adjustment parameter, that is, adjusting the playing volume of the audio to be processed to the target volume.

Figure 5:
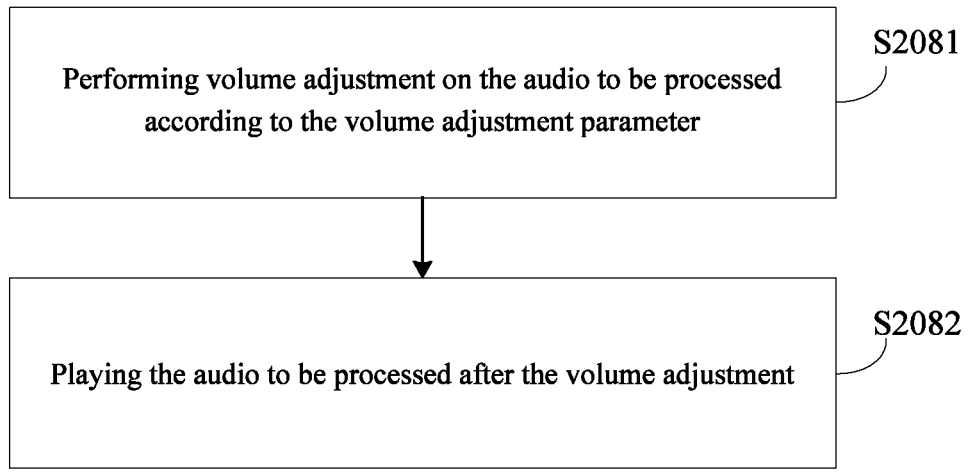
FIG. 5 is a schematic flowchart of a method for a terminal to play an audio to be processed according to a volume adjustment parameter provided by the present application.

The terminal further explains the method for audio processing provided by the present application from the perspective of the terminal in conjunction with FIG. 5, FIG. 5 is a schematic flowchart of a method for a terminal to play the audio to be processed according to a volume adjustment parameter provided by the present application. As shown in FIG. 5, the method for audio processing provided in this embodiment may include:

S2081, performing volume adjustment on the audio to be processed according to the volume adjustment parameter.

Optionally, in this embodiment, a preset volume value is stored in the terminal, and the preset volume value is −3 db. In this embodiment, the terminal can obtain the volume adjustment coefficient of the audio to be processed according to the volume adjustment parameter and the preset volume value. The volume adjustment parameter is the average value of the volume value of the audio to be processed obtained in the above FIG. 4.

The volume adjustment coefficient of the audio to be processed can be obtained by following formula 3:

$$G = \frac{A}{M_{avg}} \quad \text{Formula 3}$$

G represents the volume adjustment coefficient of the audio to be processed, $M_{avg}$ represents the volume adjustment parameter, A represents the preset volume value.

After obtaining the audio adjustment coefficient of the audio to be processed, adjust the volume of each frame of audio of the audio to be processed according to the volume adjustment coefficient. The audio information further includes: audio quantization value of each sample point in each audio segment of the audio to be processed. Adjust the volume of each frame of audio in the audio to be processed according to the volume adjustment coefficient and the audio quantization value of each sample point in each audio segment of the audio to be processed.

Optionally, after obtaining the audio to be processed, the terminal may determine the volume value of each sample point in each audio segment according to the audio quantization value of each sample point in each audio segment of the audio to be processed, that is, determining the volume value of each sample point in the audio to be processed. The manner of determining the volume value of each sample point according to the audio quantization value of each sample point can be obtained according to the above formula 1.

In this embodiment, the audio to be processed may be subjected to framing processing to obtain the volume value of the sampling point in each frame of audio. The terminal obtains the volume adjustment coefficient, and may adjust the volume of each frame of audio of the audio to be processed. Optionally, the volume value of each sample point in each frame of audio can be multiplied by the volume adjustment coefficient to determine the target volume of each sample point in each frame of audio.

Optionally, if the adjusted volume of each frame of audio of the audio to be processed is within the volume preset range, the audio to be processed after the volume adjustment can be directly played according to the target volume of each sample point in each frame of audio.

Optionally, since the cutoff protection processing is performed only on the volume upper limit value of the audio to be processed in the steps of the above embodiment, but not the volume lower limit value of the audio to be processed, correspondingly, when the adjust volume of the $x^{th}$ frame of audio is not within the preset range of volume, it is determined that the lower limit of the adjust volume of the $x^{th}$ frame of audio exceeds the lower limit of the volume preset range, and then the reduction processing is performed on the volume adjustment parameter, so as to re-adjust the volume of the $x^{th}$ frame of audio to make the re-adjusted volume of the $x^{th}$ frame of audio is within the volume preset range.

For example, if the volume preset range is [−4 db, −2 db], and the adjusted volume of the $x^{th}$ frame of audio is not in the volume preset range, the reduction processing needs to be performed on the volume adjustment parameter, that is, the reduction processing needs to be performed on the average value of the volume value of the audio to be processed. The manner of performing the reduction processing may be performing the reduction processing on the volume adjustment parameter according to a certain reduction interval. For example, the volume adjustment parameter is 30 db, the reduction processing may be performed to reduce 2 db of the volume adjustment parameter each time. Further, the volume of the $x^{th}$ frame of audio is re-adjusted according to the volume adjustment parameter after the reduction processing, so that the re-adjusted volume of the $x^{th}$ frame of audio is within the volume preset range. That is, in this embodiment, the volume of the $x^{th}$ frame of audio after the re-adjusting according to the volume adjustment parameter after the reduction process, is within the volume preset range.

S2082, playing the audio to be processed after the volume adjustment.

The adjusted audio to be processed is played frame by frame according to a time order of each frame of audio in the audio to be processed. Playing each frame of the audio to be processed after the audio adjustment can be: playing the audio to be processed after the volume adjustment frame by frame according to the target volume of each sample point in each frame of audio.

In this embodiment, the terminal can adjust the playing volume of each frame of the audio to be processed to the target volume according to the volume adjustment parameter, and can make the target volume (adjusted volume) of each frame of the audio is within the preset volume range. It ensures that the volume of the audio with different sources is within the preset volume range, which avoids the problem of frequent adjustment of the volume by the user.

Optionally, in another embodiment provided by the present application, the steps in S201-S203 and S208 in the foregoing embodiment may be performed by the terminal. In this case, the steps in S204-S207 may not be performed.

Figure 6:
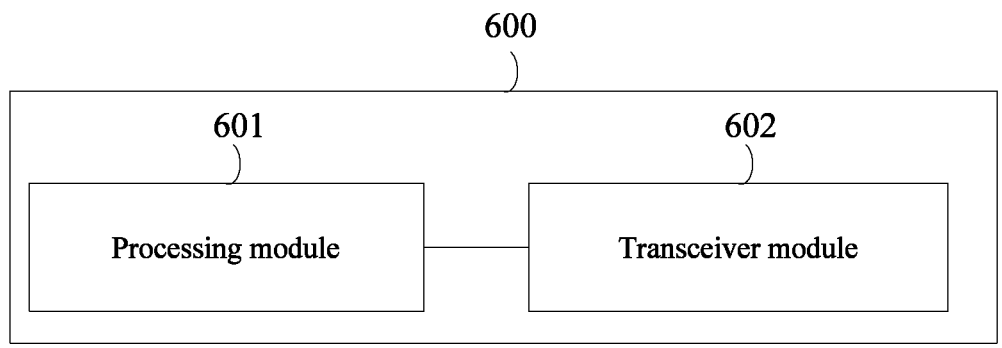
FIG. 6 is a schematic structural diagram of an apparatus for audio processing provided by the present application.

FIG. 6 is a schematic structural diagram of an apparatus for audio processing provided by the present application. The apparatus for audio processing can be a server or a terminal. As shown in FIG. 6, the apparatus for audio processing 600 includes: a processing module 601 and a transceiver module 602.

the processing module 601, configured to perform a segmentation processing on an audio to be processed to obtain N audio segments, N is an integer larger than or equal to 2; obtain a target sequence according to maximum volume values of each of the audio segments, the target sequence includes: maximum volume values of M audio segments sorted in order of maximum volume values from large to small, M is a positive integer smaller than N; obtain a volume adjustment parameter of the audio to be processed according to the target sequence, the volume adjustment parameter is used to adjust playing volume of the audio to be processed to target volume.

Optionally, the volume adjustment parameter is an average value of the volume values of the audio to be processed.

The processing module 601 is specifically configured to, if each difference value between two adjacent maximum volume values in the target sequence is smaller than or equal to a difference value threshold, obtain the average value of the volume values of the audio to be processed according to an average value of the maximum volume values of the target sequence and a duration of the audio to be processed; or, if there is a difference value between two adjacent maximum volume values in the target sequence that is larger than the difference value threshold, delete all the maximum volume values after the larger maximum volume value from the target sequence to obtain a processed target sequence, each difference value between two adjacent maximum volume values in the processed target sequence is smaller than or equal to the difference value threshold; take an average value of the maximum volume values of the processed target sequence as the average value of the maximum volume values of the target sequence, and obtain the average value of the volume values of the audio to be processed according to the average value of the maximum volume values of the target sequence and the duration of the audio to be processed.

Optionally, the processing module 601 is specifically configured to, if the duration of the audio to be processed is less than or equal to a duration threshold, take the average value of the maximum volume values of the target sequence as a candidate average value; if the duration of the audio to be processed is larger than the duration threshold, determine a smooth processing coefficient according to the target sequence; process the average value of the maximum volume values of the target sequence according to the smooth processing coefficient to obtain the candidate average value; and obtain the average value of the volume values of the audio to be processed according to the candidate average value.

Optionally, the processing module 601 is specifically configured to, obtain a cutoff volume value according to the candidate average value, a preset volume value, and a first maximum volume value in the target sequence; if the cutoff volume value is smaller than or equal to 0, take the candidate average value as the average value of the volume values of the audio to be processed; if the cutoff volume value is larger than 0, performing a reduction processing on the candidate average value, such that the cutoff volume value obtained according to a candidate average value after the reduction processing is smaller than or equal to 0, and take the candidate average value after the reduction processing as the average value of the volume values of the audio to be processed.

Optionally, the maximum volume value of each audio segment is: a volume value corresponding to a maximum audio quantization value of each of the audio segments.

The processing module 601 is specifically configured to, determine the maximum audio quantization value of each of the audio segments according to audio quantization values of each sample point in each audio segment; obtain maximum volume values of each of the audio segments according to the maximum audio quantization values of each of the audio segments; sort the maximum volume values of the N audio segments in order of maximum volume values from large to small to obtain an initial sequence; determining the M according to the duration of the audio to be processed, and a correspondence between a duration of audio and an amount of maximum volume value of audio segment included in a target sequence; extract top M maximum volume values from the initial sequence to obtain the target sequence.

Optionally, the processing module 601 is specifically configured to, perform volume adjustment on the audio to be processed according to the volume adjustment parameter; and play the audio to be processed after the volume adjustment.

Optionally, the processing module 601 is specifically configured to, obtain the audio adjustment coefficient of the audio to be processed according to the volume adjustment parameter and a preset volume value; and adjust volume of each frame of audio of the audio to be processed according to the volume adjustment coefficient.

Optionally, the processing module 601 is specifically configured to, adjust the volume of each frame of audio in the audio to be processed according to the volume adjustment coefficient and audio quantization values of each sample point in each of the audio segments of the audio to be processed.

Optionally, the processing module 601 is specifically configured to, if adjusted volume of $x^{th}$ frame of audio is not within a preset range of volume, perform a reduction processing on the volume adjustment parameter; and re-adjust the volume of the $x^{th}$ frame of audio according to the volume adjustment parameter after the reduction processing, so that re-adjusted volume of the $x^{th}$ frame of audio is within the preset range of volume.

It should be understood that when the apparatus for audio processing is a terminal, the transceiver module 601 and the processing module 602 may not perform following actions.

a transceiver module 602, configured to send audio information to a terminal, the audio information includes a link address of the audio to be processed and the volume adjustment parameter, the audio information is used to instruct the terminal to obtain the audio to be processed according to the link address of the audio to be processed, and play the audio to be processed according to the volume adjustment parameter.

Optionally, the audio information further includes: audio quantization values of each sample point in each of the audio segments of the audio to be processed.

Optionally, the transceiver module 602, further configured to receive audio request information sent by the terminal, the audio request information is used to instruct to obtain the audio to be processed.

The processing module 601, further configured to obtain the audio to be processed according to the audio request information.

The apparatus for audio processing provided in this embodiment is similar to the principle and technical effects implemented by the method for audio processing, and details are not described herein again.

Figure 7:
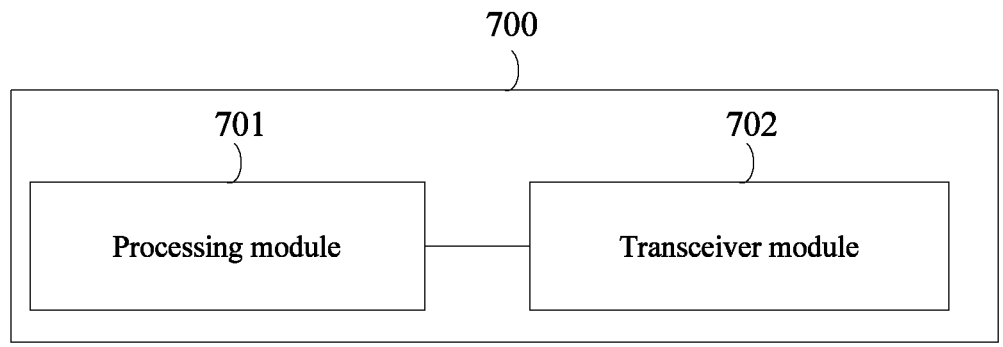
FIG. 7 is a schematic structural diagram of another apparatus for audio processing provided by the present application.

FIG. 7 is a schematic structural diagram of another apparatus for audio processing provided by the present application. The apparatus for audio processing can be a terminal. As shown in FIG. 7, the apparatus for audio processing 700 includes: a processing module 701 and a transceiver module 702.

the transceiver module 702, configured to receive audio information from a server, the audio information includes a link address of an audio to be processed and a volume adjustment parameter;

the processing module 701, configured to obtain the audio to be processed according to the link address of the audio to be processed; and play the audio to be processed according to the volume adjustment parameter.

Optionally, the transceiver module 702, further configured to send audio request information to the server, the audio request information is used to instruct the server to obtain the audio to be processed.

the processing module 701 is specifically configured to, perform volume adjustment on the audio to be processed according to the volume adjustment parameter; and play the audio to be processed after the volume adjustment.

the processing module 701 is specifically configured to, obtain an audio adjustment coefficient of the audio to be processed according to the volume adjustment parameter and a preset volume value; adjust volume of each frame of audio of the audio to be processed according to the volume adjustment coefficient.

the processing module 701 is specifically configured to, adjust the volume of each frame of audio in the audio to be processed according to the volume adjustment coefficient and the audio quantization values of each sample point in each of the audio segments of the audio to be processed.

the processing module 701 is specifically configured to, if adjusted volume of $x^{th}$ frame of audio is not within a preset range of volume, perform a reduction processing on the volume adjustment parameter; re-adjust the volume of the $x^{th}$ frame of audio according to the volume adjustment parameter after the reduction processing, so that re-adjusted volume of the $x^{th}$ frame audio is within the preset range of volume.

The apparatus for audio processing provided in this embodiment is similar to the principle and technical effects implemented by the method for audio processing, and details are not described herein again.

Figure 8:
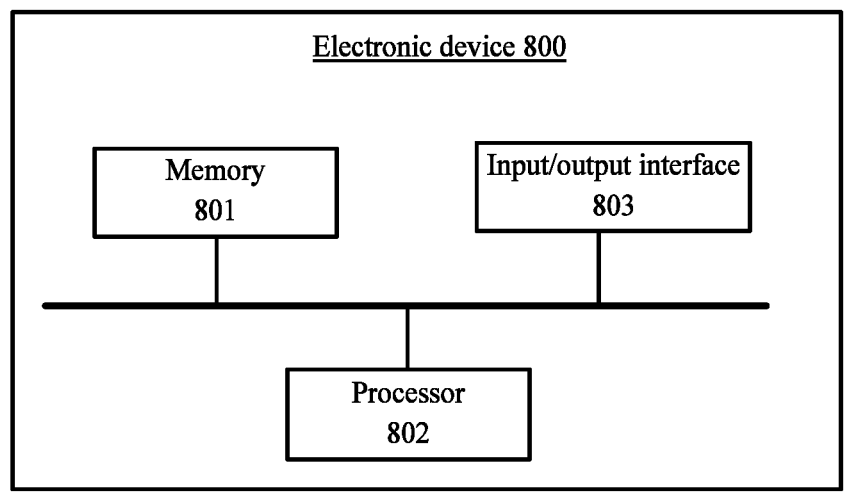
FIG. 8 is a schematic structural diagram of an electronic device provided by the present application.

FIG. 8 is a schematic structural diagram of an electronic device provided by the present application. The electronic device can be, for example, a terminal device or a server, that is, the apparatus for audio processing in FIG. 6 or FIG. 7 described above. As shown in FIG. 8, the electronic device 800 includes: a memory 801 and at least one processor 802.

the memory 801, configured to store program instructions.

the processor 802, configured to implement the method for audio processing of the present embodiment when the program instructions are executed, for the specific implementation principle, refer to the foregoing embodiment, and details are not described herein again.

The electronic device 800 may further include an input/output interface 803.

The input/output interface 803 may include a separate output interface and an input interface, or may be an integrated interface for integrating input and output. Where the output interface is used to output data, and the input interface is used to obtain input data.

The present application further provides a readable storage medium, where the readable storage medium is configured to store execution instructions, when the at least one processor of the electronic device executes the execution instructions, when the computer execution instructions are executed by the processor, the method for audio processing in the above embodiment is implemented.

The application also provides a program product, the program product comprising execution instructions, the execution instructions being stored in the readable storage medium. At least one processor of the electronic device can read the execution instructions from the readable storage medium, and the at least one processor executes the execution instructions such that the electronic device implements the method for audio processing provided by the various embodiments described above.

In the several embodiments provided by the present application, it should be understood that the disclosed apparatus and method may be implemented in other manners. For example, the device embodiments described above are merely illustrative, for example, the division of the module is only a logical function division, and the actual implementation may have another division manner, for example, multiple modules or components can be combined or can be integrated into another system, or some features can be ignored, or not executed. In addition, the mutual coupling or direct coupling or communication connection shown or discussed may be an indirect coupling or communication connection through some interfaces, devices or units, and may be electrical, mechanical or otherwise.

The module described as a separate component may or may not be physically separated, the component displayed as a module may be or may not be a physical module, that is, may be located in one place, or may be distributed to multiple network modules. The part or all of the modules may be selected according to actual needs to achieve the purpose of the solution of the embodiment.

In addition, each functional module in each embodiment of the present application may be integrated into one processing module, or each module may exist physically separately, or two or more modules may be integrated into one module. The above integrated module can be implemented in the form of hardware or in the form of hardware plus software functional modules.

The above-described integrated module implemented in the form of a software function module can be stored in a computer readable storage medium. The above software function modules are stored in a storage medium, includes instructions for causing a computer device (which may be a personal computer, server, or network device, etc.) or a processor to perform part of the steps of the methods described in various embodiments of the present application. The foregoing storage medium includes: a U disk, a mobile hard disk, a Read-Only Memory (ROM), a Random Access Memory (RAM), a disk or an optical disk and other media that can store program codes.

In the above embodiments of the server or terminal, it should be understood that the processing module may be a central processing unit (CPU), or may be other general-purpose processor, a Digital Signal Processor (DSP), an Application Specific Integrated Circuit (ASIC) etc. The general-purpose processor may be a microprocessor or the processor may be any conventional processor, etc. The steps of the method disclosed in the embodiments of the present application may be directly implemented by a hardware processor, or implemented by a combination of hardware and software modules in the processor.

Finally, it should be noted that the above embodiments are only used to explain the technical solutions of the present application, and are not limited thereto; although the present application has been described in detail with reference to the foregoing embodiments, those skilled in the art should understand that the technical solutions described in the foregoing embodiments may be modified, or some or all of the technical features may be equivalently replaced; however, these modifications or substitutions do not make the essence of corresponding technical solutions depart from of the scope of the embodiments of the present application.

What is claimed is:

1. A method for audio processing, comprising:
    performing a segmentation processing on an audio to be processed to obtain N audio segments, the N is an integer larger than or equal to 2;
    obtaining a target sequence according to maximum volume values of each of the audio segments, the target sequence includes: maximum volume values of M audio segments sorted in order of maximum volume values from large to small, the M is a positive integer smaller than the N; and
    obtaining a volume adjustment parameter of the audio to be processed according to the target sequence, the volume adjustment parameter is used to adjust playing volume of the audio to be processed to target volume.

2. The method according to claim 1, wherein the volume adjustment parameter is an average value of the volume values of the audio to be processed, the obtaining a volume adjustment parameter of the audio to be processed according to the target sequence, comprising:
    if each difference value between two adjacent maximum volume values in the target sequence is smaller than or equal to a difference value threshold, obtaining the average value of the volume values of the audio to be processed according to an average value of the maximum volume values of the target sequence and a duration of the audio to be processed; or,
    if there is a difference value between two adjacent maximum volume values in the target sequence that is larger than the difference value threshold, deleting all the maximum volume values after the larger maximum volume value from the target sequence to obtain a processed target sequence, each difference value between two adjacent maximum volume values in the processed target sequence is smaller than or equal to the difference value threshold;
    taking an average value of the maximum volume values of the processed target sequence as the average value of the maximum volume values of the target sequence, and obtaining the average value of the volume values of the audio to be processed according to the average value of the maximum volume values of the target sequence and the duration of the audio to be processed.

3. The method according to claim 2, wherein the obtaining the average value of the volume values of the audio to be processed according to the average value of the maximum volume values of the target sequence and the duration of the audio to be processed, comprising:
    if the duration of the audio to be processed is less than or equal to a duration threshold, taking the average value of the maximum volume values of the target sequence as a candidate average value;
    if the duration of the audio to be processed is larger than the duration threshold, determining a smooth processing coefficient according to the target sequence;
    processing the average value of the maximum volume values of the target sequence according to the smooth processing coefficient to obtain the candidate average value; and
    obtaining the average value of the volume values of the audio to be processed according to the candidate average value.

4. The method according to claim 3, wherein the obtaining the average value of the volume values of the audio to be processed according to the candidate average value, comprising:
    obtaining a cutoff volume value according to the candidate average value, a preset volume value, and a first maximum volume value in the target sequence;
    if the cutoff volume value is smaller than or equal to 0, taking the candidate average value as the average value of the volume values of the audio to be processed;
    if the cutoff volume value is larger than 0, performing a reduction processing on the candidate average value such that the cutoff volume value obtained according to a candidate average value after the reduction processing is smaller than or equal to 0, and taking the candidate average value after the reduction processing as the average value of the volume values of the audio to be processed.

5. The method according to claim 1, wherein the maximum volume value of each of the audio segments is: a volume value corresponding to a maximum audio quantization value of each of the audio segments, the obtaining a target sequence according to maximum volume values of each of the audio segments, comprising:
    determining the maximum audio quantization value of each of the audio segments according to audio quantization values of each sample point in each of the audio segments;
    obtaining maximum volume values of each of the audio segments according to the maximum audio quantization values of each of the audio segments;
    sorting the maximum volume values of the N audio segments in order of maximum volume values from large to small to obtain an initial sequence;
    determining the M according to the duration of the audio to be processed, and a correspondence between a duration of audio and an amount of maximum volume value of audio segment included in a target sequence; and
    extracting top M maximum volume values from the initial sequence to obtain the target sequence.

6. The method according to claim 5, wherein the method further comprises:

sending audio information to a terminal, the audio information includes a link address of the audio to be processed and the volume adjustment parameter, the audio information is used to instruct the terminal to obtain the audio to be processed according to the link address of the audio to be processed, and play the audio to be processed according to the volume adjustment parameter.

7. The method according to claim 6, wherein the audio information further comprises: audio quantization values of each sample point in each of the audio segments of the audio to be processed.

8. The method according to claim 6, wherein before the performing a segmentation processing on an audio to be processed to obtain N audio segments, further comprising:

receiving audio request information sent by the terminal, wherein the audio request information is used to instruct to obtain the audio to be processed; and obtaining the audio to be processed according to the audio request information.

9. The method according to claim 5, wherein the method further comprises:

performing volume adjustment on the audio to be processed according to the volume adjustment parameter; and playing the audio to be processed after the volume adjustment.

10. The method according to claim 9, wherein the performing volume adjustment on the audio to be processed according to the volume adjustment parameter, comprising:

obtaining the audio adjustment coefficient of the audio to be processed according to the volume adjustment parameter and a preset volume value; and adjusting volume of each frame of audio of the audio to be processed according to the volume adjustment coefficient.

11. The method according to claim 10, wherein the adjusting volume of each frame of audio of the audio to be processed according to the volume adjustment coefficient, comprising:

adjusting the volume of each frame of audio in the audio to be processed according to the volume adjustment coefficient, and audio quantization values of each sample point in each of the audio segments of the audio to be processed.

12. The method according to claim 11, wherein the method further comprises:

if adjusted volume of xth frame of audio is not within a preset range of volume, performing a reduction processing on the volume adjustment parameter; and re-adjusting the volume of the xth frame of audio according to the volume adjustment parameter after the reduction processing, so that re-adjusted volume of the xth frame of audio is within the preset range of volume.

13. An electronic device, comprising: at least one processor and a memory;

the memory is configured to store computer execution instructions;

the at least one processor is configured to execute the computer execution instructions stored in the memory, such that the electronic device performs the method according to claim 1.

14. A method for audio processing, comprising:

receiving audio information from a server, the audio information includes a link address of an audio to be processed and a volume adjustment parameter of the audio to be processed;

obtaining the audio to be processed according to the link address of the audio to be processed; and playing the audio to be processed according to the volume adjustment parameter of the audio to be processed;

wherein the playing the audio to be processed according to the volume adjustment parameter of the audio to be processed, comprising:

performing volume adjustment on the audio to be processed according to the volume adjustment parameter of the audio to be processed; and playing the audio to be processed after the volume adjustment;

wherein the performing volume adjustment on the audio to be processed according to the volume adjustment parameter of the audio to be processed, comprising:

obtaining an audio adjustment coefficient of the audio to be processed according to the volume adjustment parameter of the audio to be processed and a preset volume value;

adjusting volume of each frame of audio of the audio to be processed according to the volume adjustment coefficient;

wherein the audio information further comprises: audio quantization values of each sample point in each audio segment of the audio to be processed, the adjusting the volume of each frame of audio of the audio to be processed according to the volume adjustment coefficient, comprising:

adjusting the volume of each frame of audio in the audio to be processed according to the volume adjustment coefficient, and the audio quantization values of each sample point in each of the audio segments of the audio to be processed.

15. The method according to claim 14, wherein before the receiving audio information from a server, further comprising:

sending audio request information to the server, the audio request information is used to instruct the server to obtain the audio to be processed.

16. The method according to claim 14, wherein the method further comprises:

if adjusted volume of xth frame of audio is not within a preset range of volume, performing a reduction processing on the volume adjustment parameter;

re-adjusting the volume of the xth frame of audio according to the volume adjustment parameter after the reduction processing, so that re-adjusted volume of the xth frame audio is within the preset range of volume.

17. An electronic device, comprising: at least one processor and a memory;

the memory is configured to store computer execution instructions;

the at least one processor is configured to execute the computer execution instructions stored in the memory, such that the electronic device performs the method according to claim 14.

* * * * *